US008822320B2

(12) United States Patent
Cheng et al.

(10) Patent No.: US 8,822,320 B2
(45) Date of Patent: Sep. 2, 2014

(54) DENSE FINFET SRAM

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, CA (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 13/681,761

(22) Filed: Nov. 20, 2012

(65) Prior Publication Data

US 2014/0138797 A1    May 22, 2014

(51) Int. Cl.
*H01L 29/78* (2006.01)
*H01L 29/66* (2006.01)

(52) U.S. Cl.
USPC ........... 438/585; 438/390; 438/283; 438/151; 438/275; 257/618; 257/288; 257/401; 257/314; 257/E21.409

(58) Field of Classification Search
CPC ............ H01L 29/78; H01L 21/823807; H01L 27/1052; H01L 29/66; H01L 21/8221; H01L 21/823864; H01L 27/108; H01L 27/10826; H01L 27/10879; H01L 27/10894
USPC .......... 438/585, 390, 283, 151, 275; 257/618, 257/288, 401, 314, E21.409, E21.654
See application file for complete search history.

(56) References Cited

U.S. PATENT DOCUMENTS

| | | | |
|---|---|---|---|
| 6,492,212 B1 | 12/2002 | Ieong et al. | |
| 6,794,256 B1 | 9/2004 | Fuselier et al. | |
| 6,875,703 B1 | 4/2005 | Furukawa et al. | |
| 7,763,531 B2 | 7/2010 | Abadeer et al. | |
| 8,158,482 B2 | 4/2012 | Hoentschel et al. | |
| 2007/0034972 A1* | 2/2007 | Chau et al. ..................... | 257/401 |
| 2009/0159936 A1 | 6/2009 | Shah et al. | |
| 2011/0020987 A1* | 1/2011 | Hareland et al. .............. | 438/151 |
| 2012/0068264 A1 | 3/2012 | Cheng et al. | |
| 2012/0126325 A1 | 5/2012 | Wang et al. | |

OTHER PUBLICATIONS

Basker, V.S., et al. "A 0.063 μm2 FinFET SRAM Cell Demonstration With Conventional Lithography Using a Novel Integration Scheme With Aggressively Scaled Fin and Gate Pitch" 2010 Symposium on VLSI Technology Digest of Technical Papers. Jun. 2010. pp. 19-20.
Kawasaki, et al. "Challenges and Solutions of FinFET Integration in an SRAM Cell and a Logic Circuit for 22 NM Node and Beyond" 2009 IEEE International Electron Devices Meeting (IEDM). Dec. 2009. pp. 12.1.1-12.1.4.

* cited by examiner

*Primary Examiner* — Cathy N Lam
(74) *Attorney, Agent, or Firm* — Tutunjian & Bitetto, P.C.; Vazken Alexanian

(57) ABSTRACT

A method for fabricating the device includes patterning a first structure and a second structure on a semiconductor device. A first angled ion implantation is applied to the second structure such that the first structure is protected and a second angled ion implantation is applied to the first structure such that the second structure is protected, wherein exposed portions of the first and second structures have an altered rate of oxidation. Oxidation is performed to form thicker or thinner oxide portions on the exposed portions of the first and second structures relative to unexposed portions of the first and second structures. Oxide portions are removed to an underlying layer of the first and second structures. The first and second structures are removed. Spacers are formed about a periphery of remaining oxide portions. The remaining oxide portions are removed. A layer below the spacers is patterned to form integrated circuit features.

16 Claims, 10 Drawing Sheets

DENSE FINFET SRAM

BACKGROUND

1. Technical Field

The present invention relates to integrated circuit processing, and more particularly to dense fin field effect transistor static random-access memory.

2. Description of the Related Art

FinFETs (fin field effect transistors) have become a viable device architecture for 22 nm nodes and beyond. However, the formation of finFET SRAM (static random-access memory) and finFET logic pose new challenges. One challenge is that some devices (e.g., logic FETs, multiple-finger pull down FETs/pass gate FETs) require epitaxy and a merged source/drain region while other devices (e.g., pull up FETs) only require epitaxy over the source/drain region, without the merging. Conventionally, dummy fins are utilized to accommodate the merge/unmerge issue. Unfortunately, dummy fins result a number of problems, such as an increase in SRAM cell size and tight overlay control in fin patterning (removing dummy fin).

For 10 nm nodes, there is no known solution for forming SRAM finFETs with fin pitch below 20 nm due to the lack of known patterning techniques to meet the tight overlay requirement.

SUMMARY

A method for fabricating a semiconductor device includes patterning a first structure and a second structure on a semiconductor device. A first angled ion implantation is applied to the second structure such that the first structure is protected and a second angled ion implantation is applied to the first structure such that the second structure is protected, wherein exposed portions of the first and second structures have an altered rate of oxidation. Oxidation is performed to form thicker or thinner oxide portions on the exposed portions of the first and second structures relative to unexposed portions of the first and second structures. Oxide portions are removed to an underlying layer of the first and second structures. The first and second structures are removed. Spacers are formed about a periphery of remaining oxide portions. The remaining oxide portions are removed. A layer below the spacers is patterned to form integrated circuit features.

A method for fabricating a semiconductor device includes patterning a first mandrel structure and a second mandrel structure on a semiconductor device. A first angled ion implantation is applied to the second mandrel structure such that the first mandrel structure is protected and a second angled ion implantation is applied to the first mandrel structure such that the second mandrel structure is protected, wherein exposed portions of the first and second mandrel structures have an enhanced rate of oxidation. Oxidation is performed to form thick oxide portions on the exposed portions of the first and second mandrel structures relative to unexposed portions of the first and second mandrel structures. Oxide portions are removed to an underlying layer of the first and second mandrel structures. The first and second mandrel structures are removed. Spacers are formed about a periphery of remaining oxide portions. The remaining oxide portions are removed. A layer below the spacers is patterned to form integrated circuit features.

A semiconductor device includes a plurality of fins formed on a semiconductor substrate having a plurality of pitches. A plurality of devices are formed across two or more of the plurality of fins. The plurality of devices include a first device including merged fins and a second device including unmerged fins.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
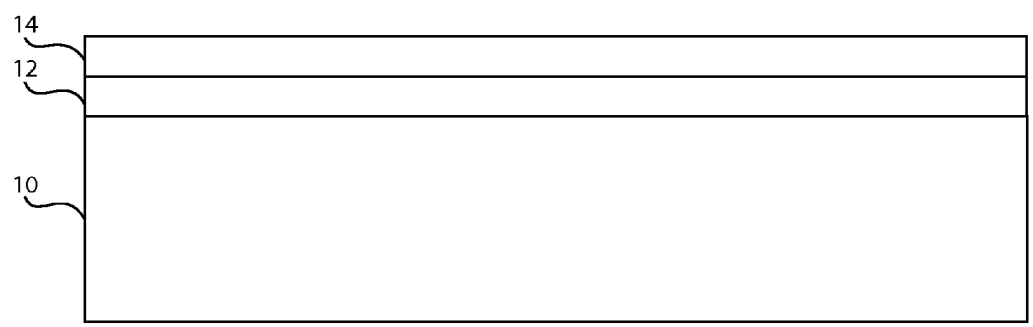
FIG. 1 is a cross-sectional view of a semiconductor structure including a substrate with a hardmask formed thereon, in accordance with one illustrative embodiment.

In accordance with the present principles, a method and device are provided for a dense finFET (fin field effect transistor) SRAM (static random-access memory). Using angled ion implantation into select portions of mandrels, the oxidation rate may be altered. For example, the implanted species may include fluorine to enhance the oxidation rate of exposed portions, or nitrogen to reduce the oxidation rate of exposed portions. Other ion types are also contemplated. Next, oxidation is performed to form thick oxide and thin oxide, according to the implanted ion type. A top layer of the oxidized portions are removed to the underlying mandrel layers, and then the mandrels are removed. Spacers are formed around the remaining oxidized portions and the remaining oxidized portions are removed. The spacers are employed as a mask to form fins. Advantageously, the present principles provide fins with a dense fin pitch which enables both merged fins and unmerged fins without the use of dummy fins, eliminating the problems associated with dummy fins.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a semiconductor substrate 10 is shown having a mask formed thereon. The mask may include a hardmask, such as, e.g., amorphous silicon 14 on silicon nitride 12. Substrate 10 may include a semiconductor-on-insulator substrate (SOI), bulk substrate, etc. It should be understood that the substrate 10 may include any material and is not limited to SOI or bulk materials. For example, substrate 10 may include Gallium Arsenide, monocrystalline silicon, Germanium or any other material or combination of materials. In some embodiments, the substrate 10 further comprises other features or structures that are formed on or in the semiconductor substrate in previous process steps.

Figure 2:
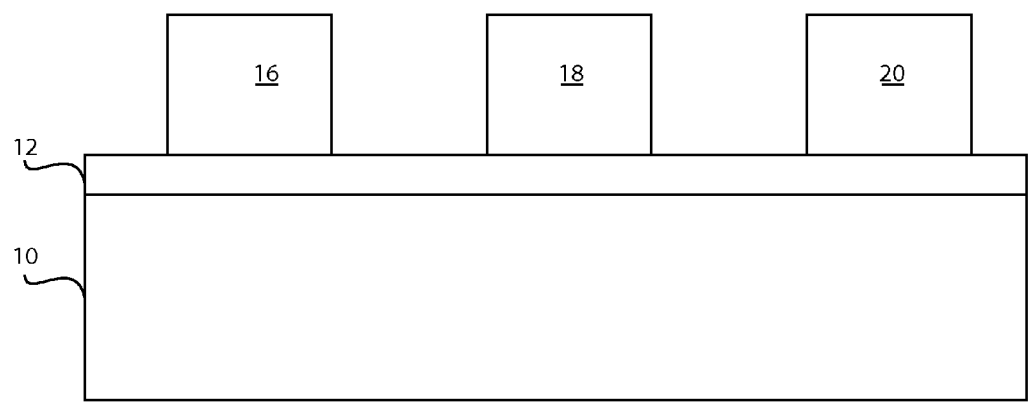
FIG. 2 is a cross-sectional view of the structure patterned to form mandrels, in accordance with the present principles.

Referring to FIG. 2, the structure of FIG. 1 is processed to form amorphous silicon mandrels 16, 18 and 20. Amorphous silicon layer 14 is patterned, preferably using a lithographic process that may include a resist layer (not shown) and lithographic patterning. It is noted that the structure is not limited to mandrels 16, 18 and 20, but may include any number of mandrels.

Figure 3:
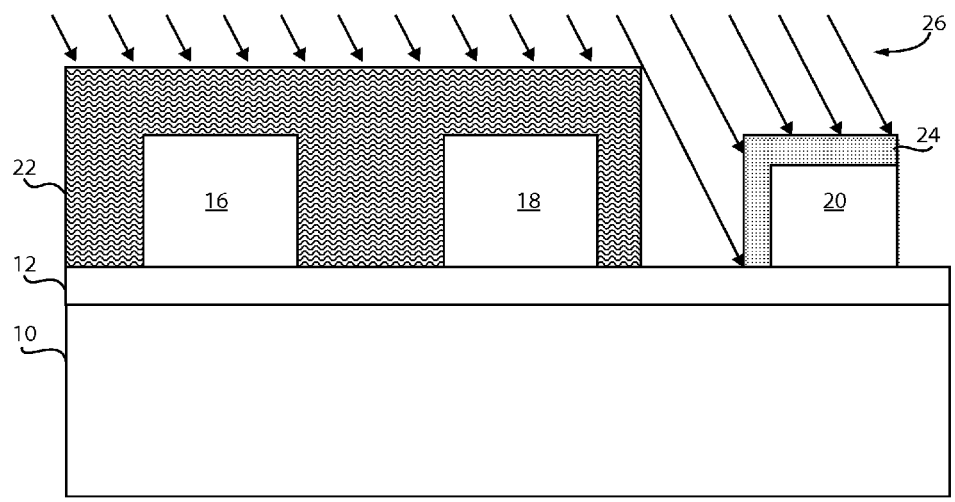
FIG. 3 is a cross-sectional view of the structure of FIG. 2 having portions of a select mandrel bombarded in select portions using angled ion implantation, in accordance with one illustrative embodiment.

Referring to FIG. 3, a block mask 22 is applied over mandrels 16 and 18. The mask 22 preferably includes a photoresist mask. Mask 22 may be formed by a deposition process and preferably include an oxide, such as silicon dioxide, or a form thereof.

Angled ion implantation 26 is applied to one sidewall and the top of mandrel 20 to form implanted portions 24 of mandrel 20. Angled ion implantation 26 includes bombarding the mask 22 and mandrel 20 with ions, such as, e.g., fluorine and/or nitrogen, at angles of approximately 1 degree to about 45 degrees with respect to a vertical normal to a major surface of the device. Other angles of attack are also contemplated. Implant dose and energy may be selected according to implant species. In one embodiment, nitrogen, for example, may be implanted with an implant dose range of, e.g., $10^{12}/cm^2$ to $10^{14}/cm^2$, and the implant energy can range from, e.g., 5 keV to 50 keV. In another embodiment, fluorine, for example, may be implanted with an implant dose range of, e.g., 1 E14/$cm^2$ to 5 E14/$cm^2$, and the implant energy can range from, e.g., 1 keV to 50 keV. Other implant dosages and energies are also contemplated.

The implanted species will either enhance oxidation rate (e.g., fluorine) or reduce oxidation rate (e.g., nitrogen). It is noted that an angled implantation is employed to be able to select which portions of the mandrel 20 are bombarded. Other surfaces are to be protected from the bombardment to ensure that selective surfaces are damaged by the bombardment while other surfaces are not. In one embodiment, one portion of a mandrel(s) may be implanted with, e.g., nitrogen while another portion of a mandrel(s) may be implanted with, e.g., fluorine. Other embodiments are also contemplated.

Figure 4:
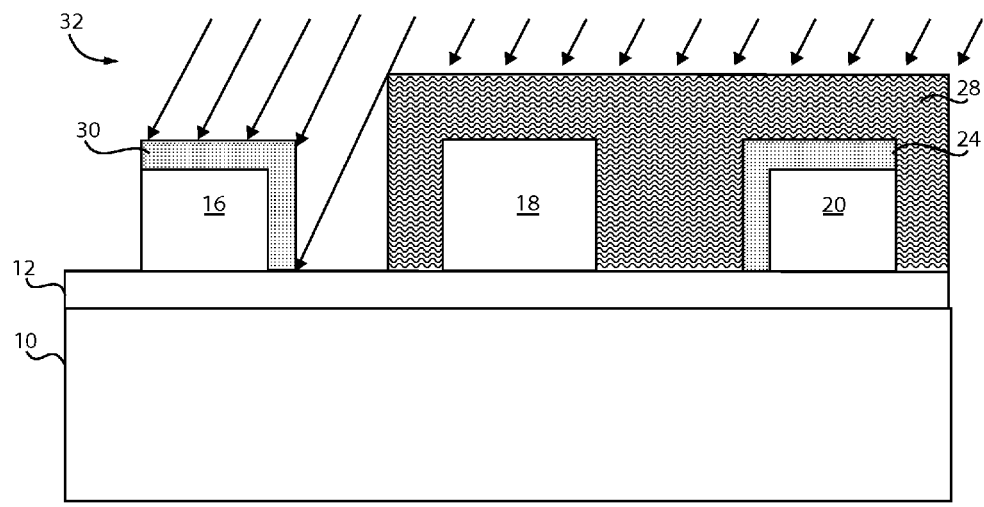
FIG. 4 is a cross sectional view of the structure of FIG. 3 having portions of a select mandrel bombarded in select portions using angled ion implantation, in accordance with one illustrative embodiment.

Referring to FIG. 4, block mask 22 is removed (e.g., resist strip) and a (e.g., photoresist) block mask 28 is applied over mandrels 18 and 20. A second angled ion implantation 32 is applied to bombard a sidewall and top of the mandrel 16 with ions, such as, e.g., fluorine and/or nitrogen, to form implanted portions 28 of mandrel 26. Block mask 28 is then removed (e.g., resist strip).

Figure 5:
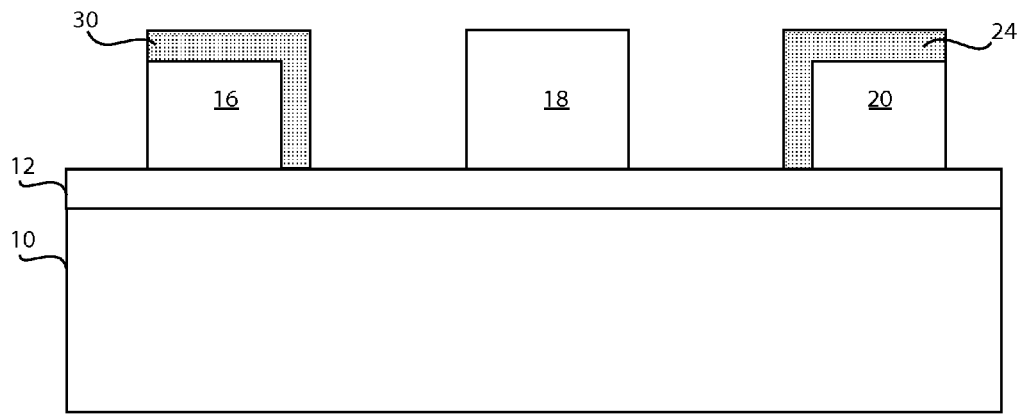
FIG. 5 is a cross-sectional view of the resulting structure of FIG. 4 after the block mask is removed, in accordance with one illustrative embodiment.

Referring to FIG. 5, a resulting structure is shown including implanted portions 24 and 30 of mandrels 16 and 20, respectively. In this exemplary embodiment, implanted portions 24 and 30 are implanted with fluorine to enhance the oxidation rate. However, it is noted that implanted portions 24 and 30 may also be implanted with nitrogen to reduce the oxidation rate. It should also be understood that the present principles are not limited to implanting fluorine and/or nitrogen, but rather, the implanted portions 24 and 30 may be implanted with any type of ion that will change the rate of oxidation.

It should further be understood that the resulting structure is not limited to implanted portions 24 and 30 of mandrels 16 and 20, respectively. Rather, any number of angled ion implantations may be performed, including any number of hard marks configured over one or more mandrels, to provide one or more implanted portions within one or more mandrels.

Figure 6:
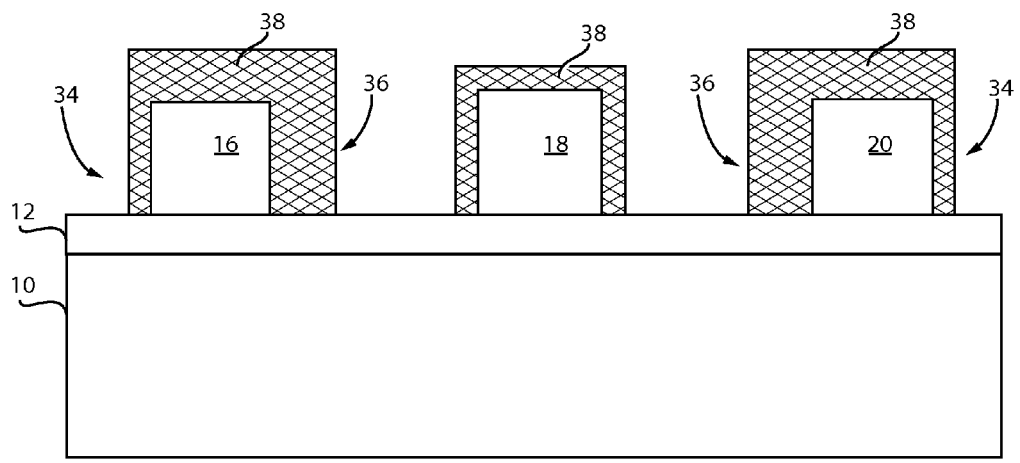
FIG. 6 is a cross-sectional view of the structure of FIG. 5 after oxidation is performed to provide thin oxide portions and thick oxide portions, in accordance with one illustrative embodiment.

Referring to FIG. 6, oxidation is performed to form oxide portions 38 on mandrels 16, 18 and 20, including thick oxide portions 36 from fluorine implanted portions 24 and 30, and thin oxide portions 34 from unimplanted portions of the mandrel. It is noted that in some embodiments, where implanted portions 24 and 30 are implanted with nitrogen or other ions to reduce the oxidation rate, oxidation results in thinner oxide portions for nitrogen implanted portions and thicker oxide portions for unimplanted portions of the mandrel (not shown).

Figure 7:
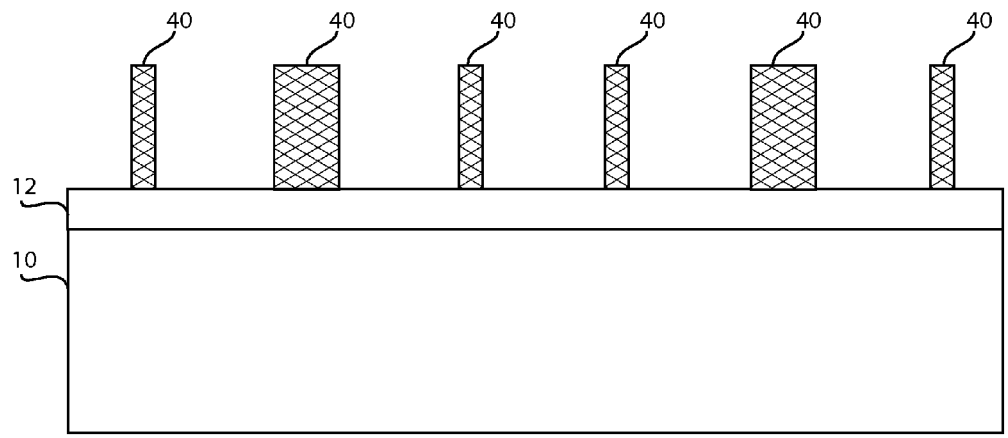
FIG. 7 is a cross-sectional view of the structure of FIG. 6 having oxide portions removed to the underlying mandrel layer and having the mandrel layer removed, in accordance with one illustrative embodiment.

Referring to FIG. 7, oxide portions 38 are etched using known etch methods, preferably to the underlying amorphous silicon layer of the mandrels 16, 18 and 20. Etching preferably includes reactive ion etching, however other forms of etching are also contemplated (e.g., wet chemical etch method, dry plasma etch method, combinations of wet chemical etch methods and dry plasma etch methods, etc.). The amorphous silicon (e.g., mandrels 16, 18 and 20) are then selectively etched (e.g., dry etch using hydrogen bromide, wet etch using potassium hydroxide, etc.). The resulting structure is depicted in FIG. 7 including remaining oxide portions 40.

It should be understood that the present principles are not limited to the asymmetric oxidation approached discussed herein. Rather, other techniques can be used for forming the mandrels with varying widths. For example, spacer deposition by angled ion implantation/etching, etc. may be employed. Other techniques are also contemplated.

Figure 8:
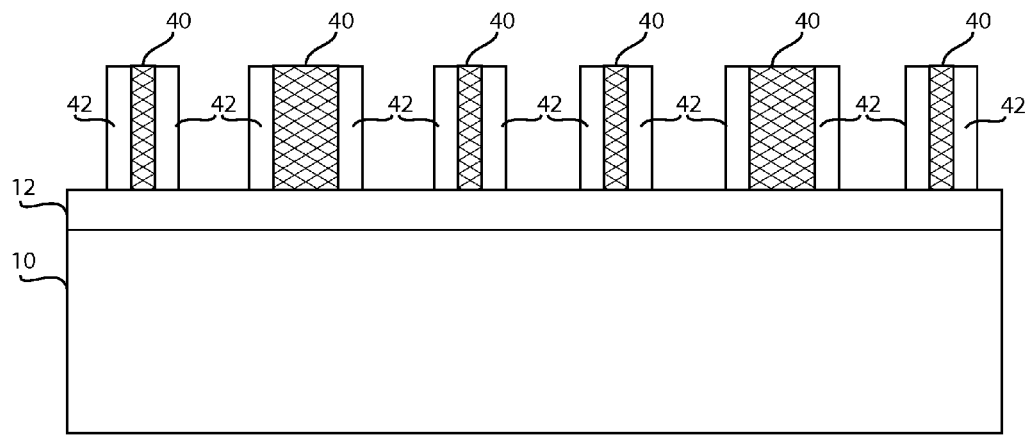
FIG. 8 is a cross-sectional view of the structure of FIG. 7 having spacers formed about a periphery of the remaining oxide portions, in accordance with one illustrative embodiment.

Referring to FIG. 8, processing continues to form spacers 42 about a periphery of remaining oxide portions 40. The spacers may include a nitride material, for example. The spacer material may be conformally deposited over nitride layer 12.

Figure 9:
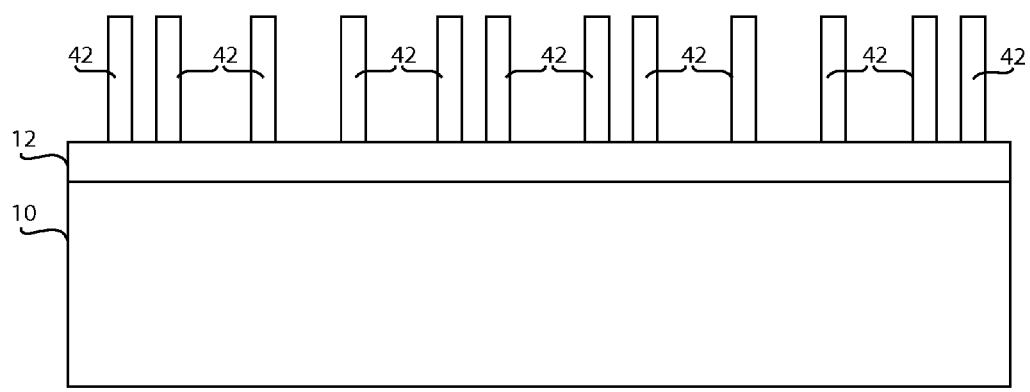
FIG. 9 is a cross-sectional view of the structure of FIG. 8 having the remaining oxide portions removed, in accordance with one illustrative embodiment.
Figure 10A:
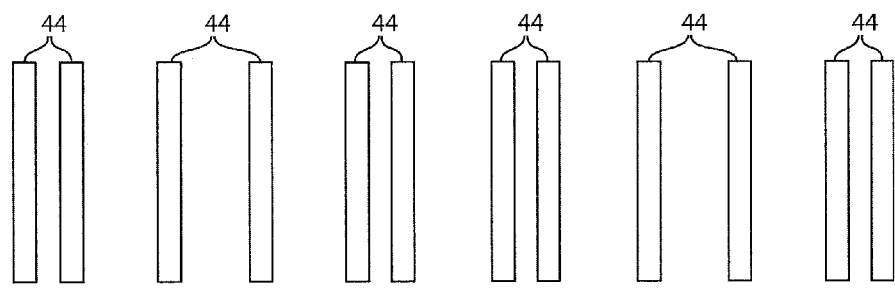
FIG. 10A is a top view of the structure of FIG. 9 having spacers employed as a mask to form fins, in accordance with one illustrative embodiment.
Figure 10B:
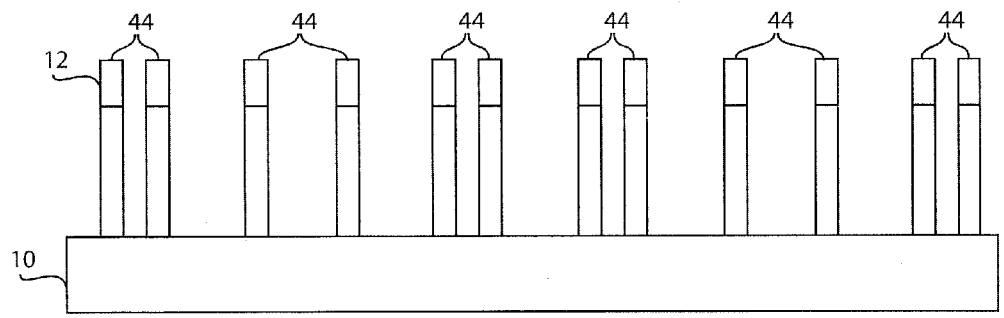
FIG. 10B is a cross-sectional view of the structure of FIG. 10A, in accordance with one illustrative embodiment.

Referring to FIG. 9, oxide portions 40 are selectively etched using known etching methods, such as, e.g., reactive ion etching. Referring to FIGS. 10A and 10B, fin structures are formed. FIG. 10A shows a top view of the structure after fins 44 are formed. FIG. 10B is a cross-sectional view of the structure after fins 44 are formed. Spacers 42 can be selectively etched to expose nitride layer 12. In one embodiment, spacers 42 are employed as a mask to etch through layer 12 and, at least in part, layer 10 to form fins 44. In an alternate embodiment, spacers 42 are removed after etching through layer 12, and layer 12 is employed as an etch mask to etch, at least in part, layer 10.

Figure 11A:
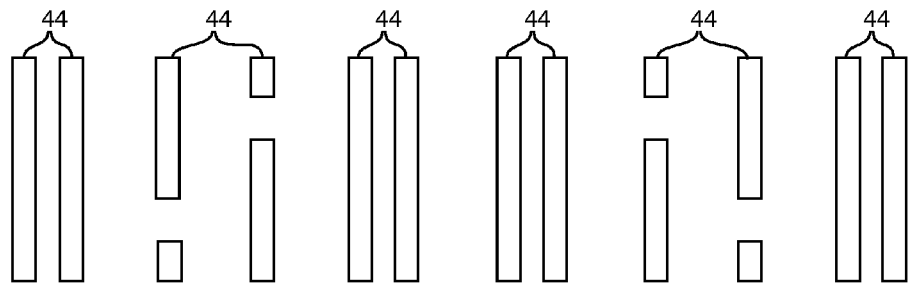
FIG. 11A is a top view of the structure of FIG. 10A having select fins cut, in accordance with one illustrative embodiment.
Figure 11B:
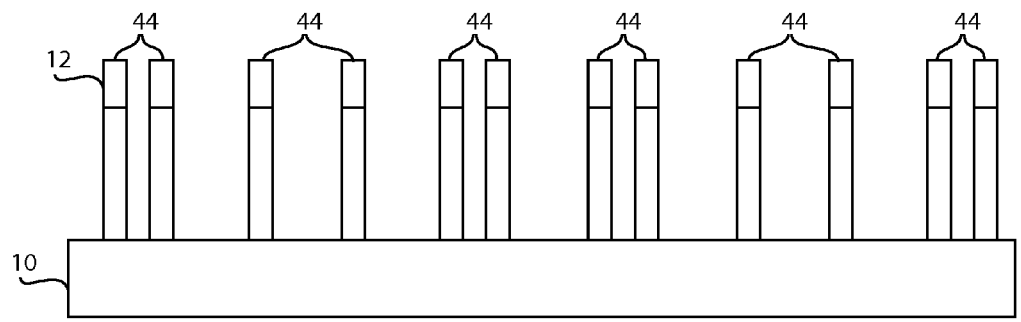
FIG. 11B is a cross-section view of the structure of FIG. 10B having select fins cut, in accordance with one illustrative embodiment.

Referring to FIGS. 11A and 11B, the structure is shown after fin cut. FIG. 11A shows a top view of the structure after fins 44 are cut. FIG. 11B shows a cross-sectional view of the structure after fins 44 are cut. Processing may continue as is known in the art.

Figure 12:
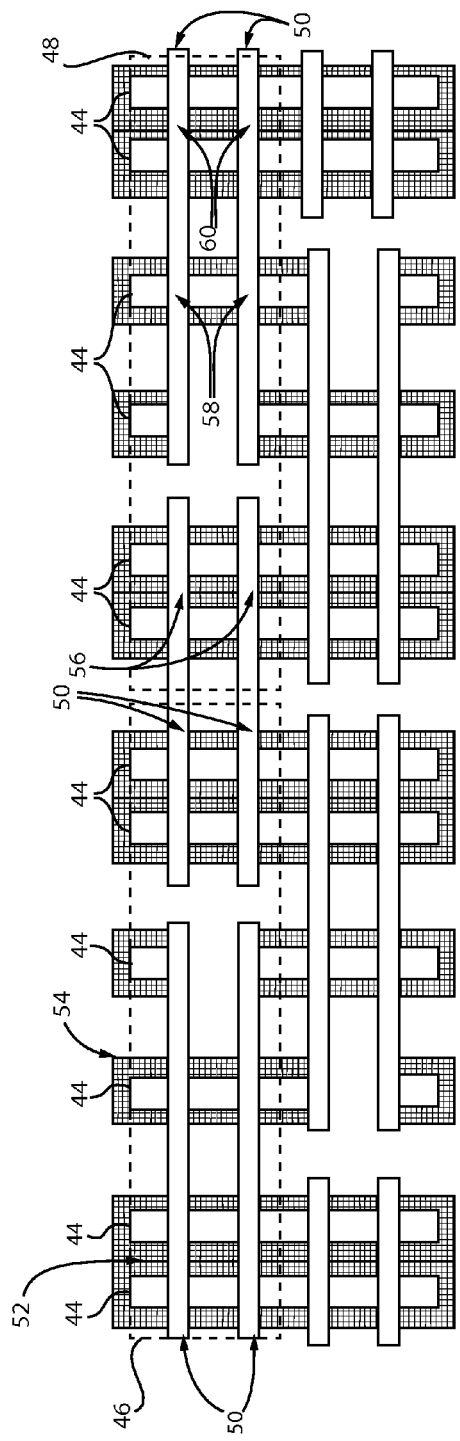
FIG. 12 is a top view of the structure of FIG. 11A after gate formation, in accordance with one illustrative embodiment.

Referring to FIG. 12, a top view of the structure is shown after gate formation in accordance with one exemplary embodiment, including first and second SRAM (static random-access memory) cells 46 and 48, respectively. SRAM cells 46 and 48 include gates 50 formed across a number of fins 44. First SRAM cell 46 includes narrow fin gap 52 with merged source/drain epitaxy. Sources and drains of adjacent fins are merged together during, e.g., the S/D epitaxy process to provide merged fins. First SRAM cell 46 also includes wide fin gap 54 with unmerged source/drain epitaxy. Second SRAM cell 48 includes pass gate devices 56 with merged source/drain epitaxy, pull down devices 60 with merged source/drain epitaxy, and pull up devices 58 with unmerged source/drain epitaxy.

Figure 13:
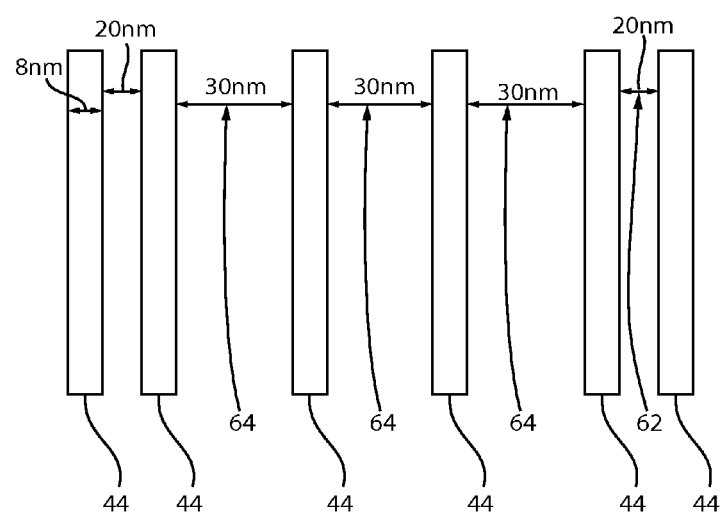
FIG. 13 is a cross-sectional view of fins provided by the present principles exemplary depicting fin pitch, in accordance with one illustrative embodiment.

Referring to FIG. 13, an exemplary fin pitch for 10 nm SRAM is illustratively depicted, in accordance with one embodiment. Fins 44 have a width of 8 nm. Narrow fin gaps 62 have a pitch of 20 nm. Wide fin gaps 64 have a pitch of 30 nm. In accordance with the present principles, a denser structure is provided than conventional 10 nm SRAM designs. Advantageously, dummy fins are not utilized, thereby eliminating all problems associated with dummy fins. In addition, a relaxed overlay control is provided.

Figure 14:
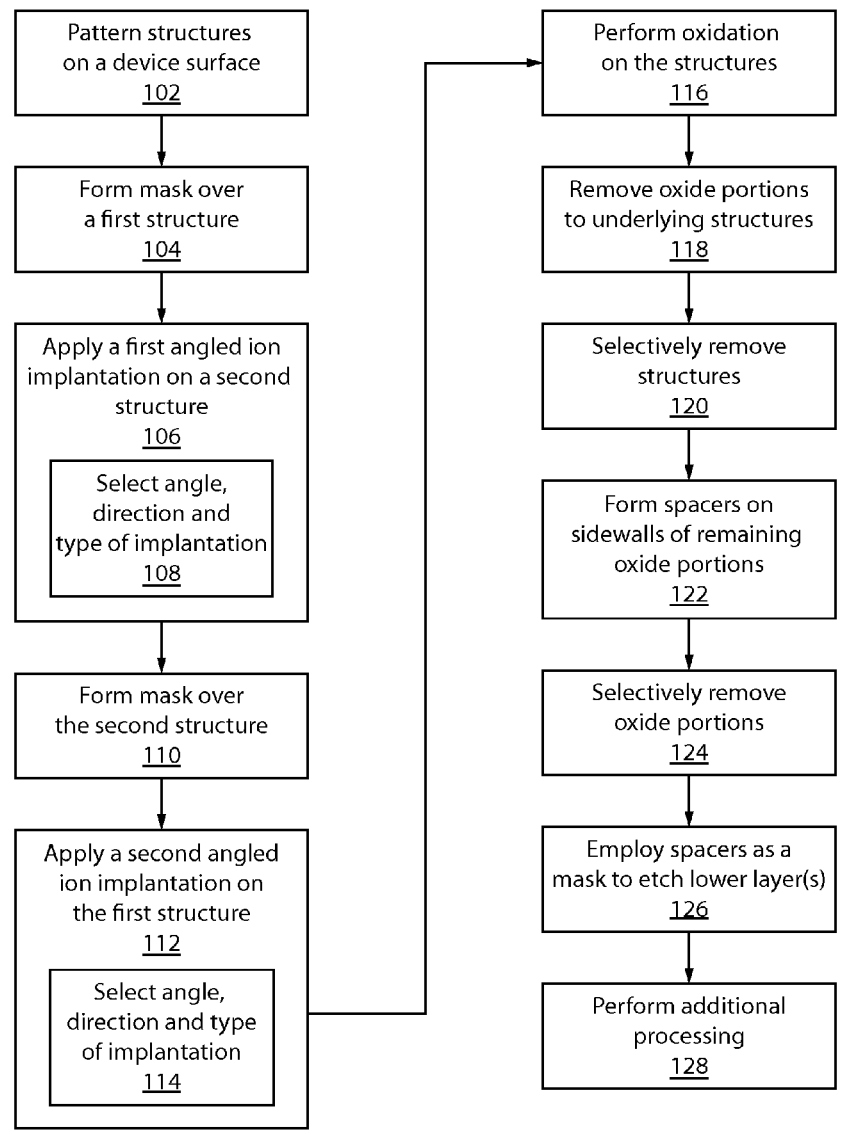
FIG. 14 is a block/flow diagram showing a method for fabrication of a semiconductor device, in accordance with one illustrative embodiment.

Referring to FIG. 14, a block/flow diagram for a method for fabrication of features in integrated circuits is illustratively depicted in accordance with a preferred embodiment. In block 102, structures are patterned on a surface of a semiconductor device. The surface may include a semiconductor substrate and may further include a hardmask, such as amorphous silicon over silicon nitride. The surface may further include other features on a semiconductor substrate formed in previous process steps. The structures preferably include first and second mandrels, which may be formed from amorphous silicon or other suitable material. The mandrels may be patterned using a lithographic method.

In block 104, a first mask is formed over a first structure. The first mask may include, e.g., a photoresist mask. In block 106, a first angled ion implantation is applied such that the first structure is protected by the mask and the second structure is unprotected. Exposed portions of the second structure have an altered oxidation rate relative to unexposed portions. In block 108, the angled ion implantation may include selecting an angle of attack, direction of ion implantation and type of ions to be implanted to modify the oxidation rate of exposed portions of the second structure. Preferably, the exposed portions include the top and sidewall portions of the second structure. In one embodiment, the first angled ion implantation is applied to implant fluorine to enhance the oxidation rate. In another embodiment, the first angled ion implantation is applied to implant nitrogen to reduce the oxidation rate. Other types of ions to alter the oxidation rate of exposed portions of the second structure are also contemplated. The first mask is then removed.

In block 110, a second (e.g., photoresist) mask is formed over the second structure. In block 112, a second angled ion implantation is applied such that the second structure is protected by the mask and the first structure is unprotected. Exposed portions of the first structure have an altered oxidation rate relative to unexposed portions. In block 114, the angled ion implantation may include selecting an angle of attack, direction of ion implantation and type of ions to be implanted to modify the oxidation rate of exposed portions of the first structure. Preferably, the exposed portions include the top and sidewall of the first structure. In one embodiment, the second angled ion implantation is applied to implant fluorine to enhance the oxidation rate. In another embodiment, the second angled ion implantation is applied to implant nitrogen to reduce the oxidation rate. Other types of ions to alter the oxidation rate of exposed portions of the first structure are also contemplated. The second mask is then removed.

It should be understood that the first and second structures may be implanted with different types of ions such that the exposed portions of the first and second structures have different oxidation rates.

In block 116, oxidation is performed. Exposed portions implanted with ions to enhance oxidation rate (e.g., fluorine) forms thick oxide relative to portions that are unexposed or implanted with ions to reduce the oxidation rate (e.g., nitrogen). Exposed portions implanted with ions to reduce oxidation rate (e.g., nitrogen) forms thin oxide relative to portions that are unexposed or implanted with ions to enhance the oxidation rate (e.g., fluorine).

In block 118, oxide portions are removed to the underlying (e.g., first and second) structures. Oxide portions may be removed by applying a reactive ion etching or other techniques as is known. In block 120, the structures are selectively removed. In block 122, spacers are formed about a periphery of the remaining oxide portions. The spacers include sidewall spacers and may be formed from a silicon nitride (nitride) or similar material. Since the oxide portions were formed thinner or thicker according to ion type, spacers of varying widths are provided.

In block 124, the remaining oxide portions are removed. This may involve, e.g., RIE. In block 126, the spacers are employed as a mask to etch lower layer(s) to form integrated circuit features. These integrated circuit features may include forming fins or other semiconductor structures in the layer below the spacers. The semiconductor device may be a silicon-on-insulator structure, and the fins may be formed in a silicon on oxide layer below the spacers. In block 128, additional processing may include forming field effect transistors, further etching through lower layers, etc.

Having described preferred embodiments of a device and method for dense finFET SRAM (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    patterning a first structure and a second structure on a semiconductor device;
    applying a first angled ion implantation to the second structure such that the first structure is protected and a second angled ion implantation to the first structure such that the second structure is protected, wherein exposed portions of the first and second structures have an altered rate of oxidation;
    performing oxidation to form thicker or thinner oxide portions on the exposed portions of the first and second structures relative to unexposed portions of the first and second structures;
    removing oxide portions to an underlying layer of the first and second structures;
    removing the first and second structures;
    forming spacers about a periphery of remaining oxide portions;
    removing the remaining oxide portions; and
    patterning a layer below the spacers to form integrated circuit features.

2. The method as recited in claim 1, wherein patterning the layer below the spacers to form integrated circuit features includes forming fins below the spacers.

3. The method as recited in claim 1, wherein patterning the layer below the spacers to form integrated circuit features includes employing the spacers as a mask to form integrated circuit features.

4. The method as recited in claim 1, wherein the first structure includes a first mandrel structure and the second structure includes a second mandrel structure.

5. The method as recited in claim 1, wherein applying the first angled ion implantation to the second structure such that the first structure is protected and the second angled ion implantation to the first structure such that the second structure is protected includes selecting an angle of attack, direction of ion implantation and type of ions to be implanted to selectively modify the oxidation rate of exposed portions of the first and second structures.

6. The method as recited in claim 1, wherein applying the first angled ion implantation to the second structure such that the first structure is protected includes forming a first mask over the first structure and wherein applying the second angled ion implantation to the first structure such that the second structure is protected includes forming a second mask over the second structure.

7. The method as recited in claim 1, wherein applying the first angled ion implantation to the second structure such that the first structure is protected includes implanting the second structure with at least one of ions to enhance a rate of oxidation and ions to reduce a rate of oxidation.

8. The method as recited in claim 7, wherein the ions to enhance the rate of oxidation includes fluorine ions.

9. The method as recited in claim 7, wherein the ions to reduce the rate of oxidation includes nitrogen ions.

10. The method as recited in claim 1, wherein applying the second angled ion implantation to the first structure such that the second structure is protected includes implanting the first structure with at least one of fluorine to enhance a rate of oxidation and nitrogen to reduce a rate of oxidation.

11. The method as recited in claim 1, wherein applying the first angled ion implantation to the second structure such that the first structure is protected includes implanting the second structure with ions to enhance a rate of oxidation and applying the second angled ion implantation to the first structure such that the second structure is protected includes implanting the first structure with ions to reduce a rate of oxidation.

12. A method for fabricating a semiconductor device, comprising:
    patterning a first mandrel structure and a second mandrel structure on a semiconductor device;
    applying a first angled ion implantation to the second mandrel structure such that the first mandrel structure is protected and a second angled ion implantation to the first mandrel structure such that the second mandrel structure is protected, wherein exposed portions of the first and second mandrel structures have an enhanced rate of oxidation;
    performing oxidation to form thick oxide portions on the exposed portions of the first and second mandrel structures relative to unexposed portions of the first and second mandrel structures;
    removing oxide portions to an underlying layer of the first and second mandrel structures;
    removing the first and second mandrel structures;
    forming spacers about a periphery of remaining oxide portions;
    removing the remaining oxide portions; and
    patterning a layer below the spacers to form integrated circuit features.

13. The method as recited in claim 12, wherein patterning the layer below the spacers to form integrated circuit features includes forming fins below the spacers.

14. The method as recited in claim 12, wherein patterning the layer below the spacers to form integrated circuit features includes employing the spacers as a mask to form integrated circuit features.

15. The method as recited in claim 12, wherein applying the first angled ion implantation to the second mandrel structure such that the first mandrel structure is protected and the second angled ion implantation to the first mandrel structure such that the second mandrel structure is protected includes selecting an angle of attack, direction of ion implantation and type of ions to be implanted to selectively modify the oxidation rate of exposed portions of the first and second mandrel structures.

16. The method as recited in claim 12, wherein applying the first angled ion implantation to the second mandrel structure such that the first mandrel structure is protected includes implanting fluorine in exposed portions of the first mandrel structure and wherein applying the second angled ion implantation to the first mandrel structure such that the second mandrel structure is protected includes implanting fluorine in exposed portions of the second mandrel structure.

* * * * *